US012616049B2

(12) United States Patent　　　(10) Patent No.: US 12,616,049 B2
Kiyono　　　　　　　　　　　　　(45) Date of Patent: Apr. 28, 2026

(54) WIRE BONDING DEVICE, MAINTENANCE METHOD AND NON-TRANSITORY COMPUTER-READABLE RECORDING MEDIUM RECORDING PROGRAM

(71) Applicant: Yamaha Robotics Co., Ltd., Tokyo (JP)

(72) Inventor: Tsutomu Kiyono, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 514 days.

(21) Appl. No.: 17/911,655

(22) PCT Filed: May 24, 2021

(86) PCT No.: PCT/JP2021/019624
§ 371 (c)(1),
(2) Date: Sep. 15, 2022

(87) PCT Pub. No.: WO2022/249243
PCT Pub. Date: Dec. 1, 2022

(65) Prior Publication Data
US 2024/0088089 A1　　　Mar. 14, 2024

(51) Int. Cl.
*H01L 23/00* (2006.01)

(52) U.S. Cl.
CPC .... *H01L 24/78* (2013.01); *H01L 2224/78901* (2013.01); *H01L 2924/40* (2013.01)

(58) Field of Classification Search
CPC ........... H01L 24/78; H01L 2224/78901; H01L 2924/40
See application file for complete search history.

(56) References Cited

U.S. PATENT DOCUMENTS 6,487,787 B1 * 12/2002 Nahum ................. G01D 5/2448
　　　　　　　　　　　　　　　　　　33/702
2011/0056267 A1 * 3/2011 Qin ....................... B06B 1/0223
　　　　　　　　　　　　　　　　　　228/1.1
(Continued)

FOREIGN PATENT DOCUMENTS

JP　　　H11176862　　　7/1999
JP　　　2004335941　　11/2004
(Continued)

OTHER PUBLICATIONS

"Office Action of Taiwan Counterpart Application", issued on May 23, 2023, with English translation thereof, p. 1-p. 13.
"Office Action of Taiwan Counterpart Application", issued on Mar. 23, 2023, with English translation thereof, p. 1-p. 13.
"Office Action of Korea Counterpart Application", issued on Apr. 17, 2024, with English translation thereof, p. 1-p. 16.
"International Search Report (Form PCT/ISA/210) of PCT/JP2021/019624," mailed on Aug. 10, 2021, pp. 1-3.
(Continued)

*Primary Examiner* — Mohammad Ali
*Assistant Examiner* — Vincent W Chang
(74) *Attorney, Agent, or Firm* — JCIPRNET

(57) ABSTRACT

A wire bonding device for bonding a wire to a target includes: a prediction part which predicts, based on time-series data of a diagnosis result regarding an operation of the wire bonding device, a transition of a change from the diagnosis result in an initial state; and a setting part which sets a time point at which the prediction part predicts that an amount of change from the diagnosis result in the initial state reaches a first threshold value as a time point for performing maintenance of the wire bonding device. The wire bonding device allows the maintenance to be performed suitably.

2 Claims, 6 Drawing Sheets

(56) References Cited

U.S. PATENT DOCUMENTS

| | | | | |
|---|---|---|---|---|
| 2012/0125977 A1* | 5/2012 | DeAngelis | ........... | H01L 24/78 |
| | | | | 228/110.1 |
| 2014/0034712 A1* | 2/2014 | Maeda | ............. | B23K 20/004 |
| | | | | 228/160 |
| 2014/0091149 A1* | 4/2014 | Finn | ................ | H01Q 21/29 |
| | | | | 29/850 |
| 2016/0087561 A1* | 3/2016 | Rho | ................. | H02P 6/28 |
| | | | | 318/400.04 |
| 2016/0358879 A1* | 12/2016 | Sasakura | ............ | H01L 24/78 |
| 2017/0052072 A1* | 2/2017 | Beaven | ............ | G05B 23/0267 |
| 2018/0142543 A1* | 5/2018 | Gupta | ............... | E21B 33/064 |
| 2019/0078251 A1* | 3/2019 | Ekbundit | ........... | D06F 33/48 |
| 2021/0072742 A1* | 3/2021 | Wu | ................... | G05B 15/02 |

FOREIGN PATENT DOCUMENTS

| | | | | | |
|---|---|---|---|---|---|
| JP | 2004335941 A | * | 11/2004 | ............ | H01L 24/78 |
| JP | 2018152481 | | 9/2018 | | |
| JP | 2020119988 | | 8/2020 | | |

OTHER PUBLICATIONS

"Office Action of China Counterpart Application", issued on Jul. 23, 2025, with English translation thereof, p. 1-p. 30.

"Office Action of China Counterpart Application", issued on Nov. 12, 2025, with English translation thereof, p. 1-p. 28.

"Office Action of China Counterpart Application", issued on Feb. 9, 2026, with English translation thereof, p. 1-p. 33.

* cited by examiner

| Type | Maintenance item | Scheduled date | | Maintenance | | Completion |
|---|---|---|---|---|---|---|
| Regular | CL cleaning | 2020/11/24 | | Maintenance | | Completion |
| Regular | CL load calibration | 2020/10/26 | | Maintenance | | Completion |
| Regular | US calibration | 2020/12/31 | | Maintenance | | Completion |
| Recommended | CL load calibration | 2020/9/30 | | Maintenance | | Completion |
| Recommended | Z calibration | 2020/12/1 | | Maintenance | | Completion |
| Recommended | XYZ optimization | 2020/11/15 | | Maintenance | | Completion |
| ... | ... | ... | | ... | | ... |

FIG. 4

WIRE BONDING DEVICE, MAINTENANCE METHOD AND NON-TRANSITORY COMPUTER-READABLE RECORDING MEDIUM RECORDING PROGRAM

CROSS-REFERENCE TO RELATED APPLICATION

This application is a 371 application of the International PCT application serial no. PCT/JP2021/019624, filed on May 24, 2021. The entirety of the above-mentioned patent application is hereby incorporated by reference herein and made a part of this specification.

TECHNICAL FIELD

The disclosure relates to a wire bonding device, a maintenance method and a non-transitory computer-readable recording medium recording a program.

RELATED ART

Conventionally, for example, known is a wire bonding device which bonds one end of a metal wire to an electronic component mounted on a substrate and bonds the other end of the metal wire to a terminal of the substrate for wiring the metal wire between the electronic component and the terminal on the substrate (see, for example, Patent Literature 1).

CITATION LIST

Patent Literature

[Patent Literature 1] Japanese Patent Lain-Open No. 2020-119988.

SUMMARY

Technical Problem

However, in the conventional technology, there is still room for improvement in the maintenance method of the wire bonding device.

The disclosure has been made in view of the above, and provides a wire bonding device, a maintenance method, and a non-transitory computer-readable recording medium recording a program capable of suitably performing maintenance.

Solution to Problem

A wire bonding device according to an embodiment of the disclosure is a wire bonding device for bonding a wire to a target. The wire bonding device includes: a prediction part which predicts, based on time-series data of a diagnosis result regarding an operation of the wire bonding device, a transition of a change from the diagnosis result in an initial state; and a setting part which sets a time point at which the prediction part predicts that an amount of change from the diagnosis result in the initial state reaches a first threshold value as a time point for performing maintenance of the wire bonding device.

A maintenance method according to an embodiment of the disclosure is a maintenance method for notifying information regarding maintenance of a wire bonding device. The maintenance method includes: a step of predicting, based on time-series data of a diagnosis result regarding an operation of the wire bonding device, a transition of a change from the diagnosis result in an initial state; and a step of setting a time point at which it is predicted that an amount of change from the diagnosis result in the initial state reaches a first threshold value as a time point for performing the maintenance of the wire bonding device.

Further, a non-transitory computer-readable recording medium recording a program according to an embodiment of the disclosure causes one or multiple computers to perform: a process of predicting, based on time-series data of a diagnosis result regarding an operation of a wire bonding device, a transition of a change from the diagnosis result in an initial state; and a process of setting a time point at which it is predicted that an amount of change from the diagnosis result in the initial state reaches a first threshold value as a time point for performing maintenance of the wire bonding device.

Effects of Invention

According to the disclosure, maintenance may be performed suitably.

BRIEF DESCRIPTION OF THE DRAWINGS

FIG. 4 is a flowchart showing an example of a setting process at a time point of maintenance of wire bonding in the wire bonding device according to an embodiment.

DESCRIPTION OF THE EMBODIMENTS

Hereinafter, a wire bonding device according to an embodiment will be described with reference to the drawings.

Figure 1:
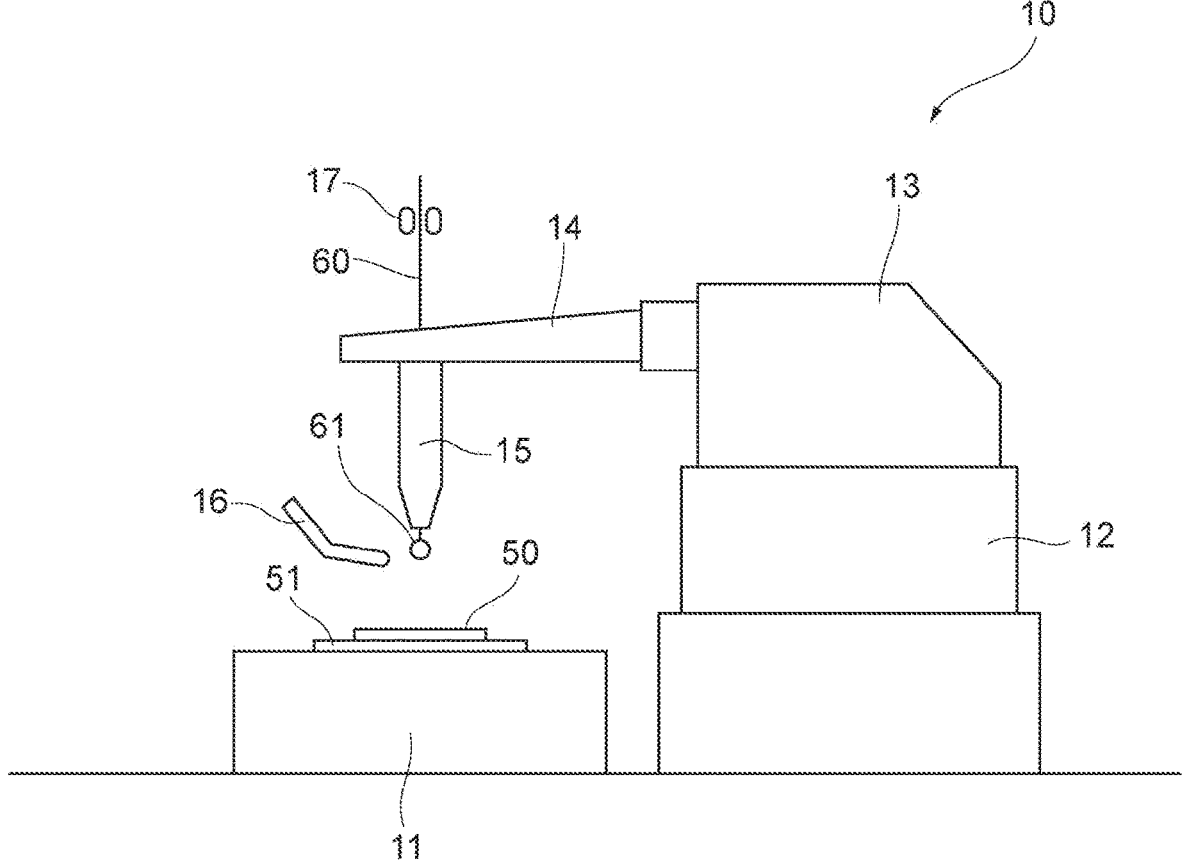
FIG. 1 is a diagram showing a configuration of a wire bonding device according to an embodiment.

As shown in FIG. 1, a wire bonding device 10 includes, for example, a stage 11, an XY table 12, a bonding head 13, a bonding arm 14, a capillary 15 (an example of a bonding tool), a discharge electrode 16, and a damper 17.

A substrate 51 on which a semiconductor chip 50 is placed is mounted on the stage 11. The stage 11 has a built-in heater (not shown) that heats a terminal of the substrate 51.

The XY table 12 is connected to the bonding head 13. The bonding head 13 is connected to the bonding arm 14 via an elevating mechanism (not shown). The bonding arm 14 is an arm that protrudes horizontally from the bonding head 13. The capillary 15 is connected to the tip of the bonding arm 14. The capillary 15 is configured to be movable relative to the semiconductor chip 50 placed on the stage 11 in the horizontal direction and the vertical direction as the bonding head 13 moves in the horizontal direction by the XY table 12 and as the bonding arm 14 moves in the vertical direction by the elevating mechanism.

The bonding arm 14 has a built-in ultrasonic vibrator. The ultrasonic vibrator applies ultrasonic vibration to the capillary 15 connected to the tip of the bonding arm 14 by applying a voltage during wire bonding.

The capillary 15 faces the stage 11 in the vertical direction and has a through hole penetrating the stage 11 in the vertical direction. A wire 60 such as a gold wire is inserted through the through hole of the capillary 15. The discharge electrode 16 is disposed in the vicinity of the capillary 15.

When a voltage is applied to the discharge electrode 16, a discharge is generated between the discharge electrode 16 and the tip of the wire 60, and the tip of the wire 60 is melted to form a ball part 61.

The damper 17 is provided above the capillary 15 and is configured to be able to clamp the wire 60 inserted through the through hole of the capillary 15.

Then, the wire bonding device 10 presses the ball part 61 formed at the first end of the wire 60 against the semiconductor chip 50 as the voltage is applied to the discharge electrode 16.

Then, the wire bonding device 10 bonds the first end of the wire 60 to the semiconductor chip 50 and then moves the capillary 15 to bend the wire 60, so that a part of the wire 60 faces the terminal of the substrate 51 in the vertical direction. Subsequently, the wire bonding device 10 presses the part of the wire 60 against the terminal of the substrate 51 as the voltage is applied to the discharge electrode 16. Then, the wire bonding device 10 bonds the part of the wire 60 to the terminal of the substrate 51 and then moves the capillary 15 upward with the wire 60 clamped by the damper 17 to cut the wire 60.

Next, the control configuration of the wire bonding device 10 will be described.

Figure 2:
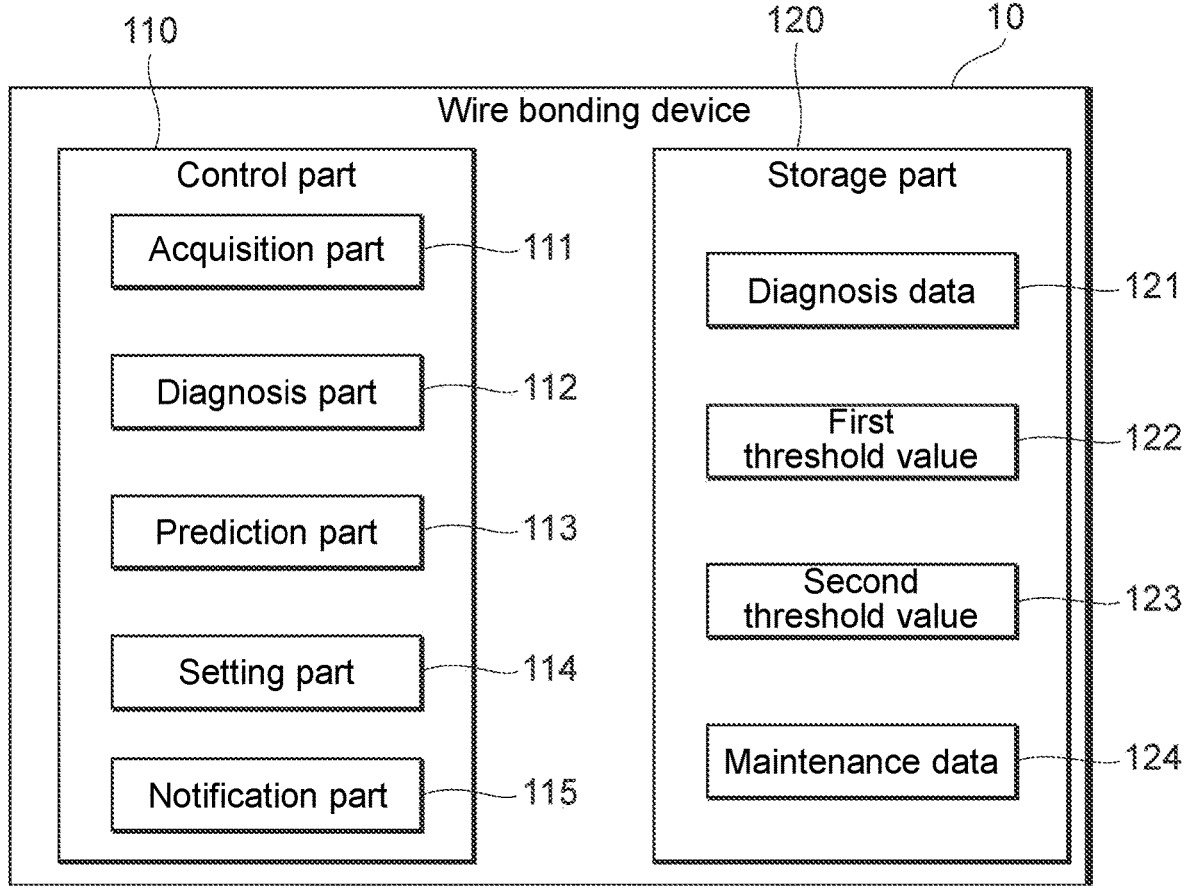
FIG. 2 is a diagram showing a control configuration of a wire bonding device according to an embodiment.

As shown in FIG. 2, the wire bonding device 10 includes, for example, a control part 110 and a storage part 120.

The control part 110 is realized by, for example, a hardware processor such as a central processing unit (CPU) performing a program (software). In addition, some or all of the components may be realized by hardware (a circuit part including circuitry) such as a large scale integration (LSI), an application specific integrated circuit (ASIC), a field-programmable gate array (FPGA), a graphics processing unit (GPU) and the like, or may be realized by the cooperation of software and hardware. The program may be stored in advance in a storage device such as an HDD or a flash memory of the wire bonding device 10, or may be stored in a removable storage medium such as a DVD or a CD-ROM, and may be installed in the HDD or flash memory of the wire bonding device 10 by mounting the storage medium to the drive device.

The storage part 120 is a non-volatile storage medium, and is configured by, for example, a hard disk drive (HDD). The storage part 120 stores various parameter values, functions, look-up tables and the like used for control and calculation, in addition to a program for performing control and processing of the wire bonding device 10. Examples of parameter values used for control and calculation include diagnosis data 121, a first threshold value 122, a second threshold value 123, and maintenance data 124.

The diagnosis data 121 is time-series data of diagnosis results regarding the operation of the wire bonding device 10, and is acquired for each bonding using the wire bonding device 10. The data items of the diagnosis data 121 include, for example, XYZ Lissajous, XYZ deviation, XY guide, Z load, US impedance, US frequency, US calibration, and CL load. For XYZ Lissajous, for example, the average of the A phase and the B phase of the Lissajous waveform is used as the diagnosis result. For the XYZ deviation, the deviation of each axis is measured, and the difference from the time of XYZ optimization is used as the diagnosis result. For the XY guide, the value obtained by subtracting the minimum value from the maximum value of the current command value in each measurement interval is used as the diagnosis result. For the Z load, the balanced load of the Z axis at the time of Z calibration is used as the diagnosis result. For the US impedance, the resonance impedance at the time of US calibration is used as the diagnosis result. For the US frequency, the resonance frequency at the time of US calibration is used as the diagnosis result. For the US calibration, the US calibration value is used as the diagnosis result. For the CL load, the value at the start of opening at the time of CL load calibration is used as the self-diagnosis, and the difference between the value at the time of calibration and the value at the time of self-diagnosis is used as the diagnosis result. The first threshold value 122 is the threshold value of the diagnosis data 121 when the maintenance time point of the wire bonding device 10 is set in advance. The second threshold value 123 is the threshold value of the diagnosis data 121 when the operation of the wire bonding device 10 is stopped. The first threshold value 122 is a value smaller than the second threshold value 123. The first threshold value 122 and the second threshold value 123 are set, for example, with the diagnosis data 121 immediately after the previous maintenance being performed as reference data. The maintenance data 124 indicates the maintenance time point of the wire bonding device 10 set by using the first threshold value 122.

The control part 110 includes, for example, an acquisition part 111, a diagnosis part 112, a prediction part 113, a setting part 114, and a notification part 115.

The acquisition part 111 acquires the diagnosis data 121 regarding the operation of the wire bonding device 10.

The diagnosis part 112 diagnoses the operation of the wire bonding device 10 based on the diagnosis data 121 acquired by the acquisition part 111.

The prediction part 113 predicts the transition of the change from the diagnosis data 121 in the initial state based on the diagnosis data 121 regarding the operation of the wire bonding device 10. The prediction part 113 calculates, for example, a function that approximates the transition of the change from the diagnosis data 121 in the initial state based on the diagnosis data 121. The initial state includes, for example, a state in which the wire bonding device is introduced, a state in which the wire bonding device is operated after maintenance, or a state in which a reset instruction is given from the screen of the wire bonding device.

The setting part 114 sets a time point at which the prediction part 113 predicts that the amount of change from the diagnosis data 121 in the initial state reaches the first threshold value 122 as a time point for performing maintenance of the wire bonding device 10. The setting part 114 sets, for example, a time point at which the function calculated by the prediction part 113 intersects with the first threshold value 122 as a time point for performing maintenance of the wire bonding device 10.

At the time point at which the prediction part 113 predicts that the amount of change from the diagnosis data 121 in the initial state reaches the first threshold value 122, the setting part 114 switches between performing the error stop of the wire bonding device or notifying the information regarding the maintenance of the wire bonding device 10 based on whether a predetermined operation is received from the user.

The notification part 115 notifies the information regarding the maintenance of the wire bonding device 10 on condition that it is set by the setting part 114 to notify the information regarding the maintenance of the wire bonding device 10.

Figure 3:
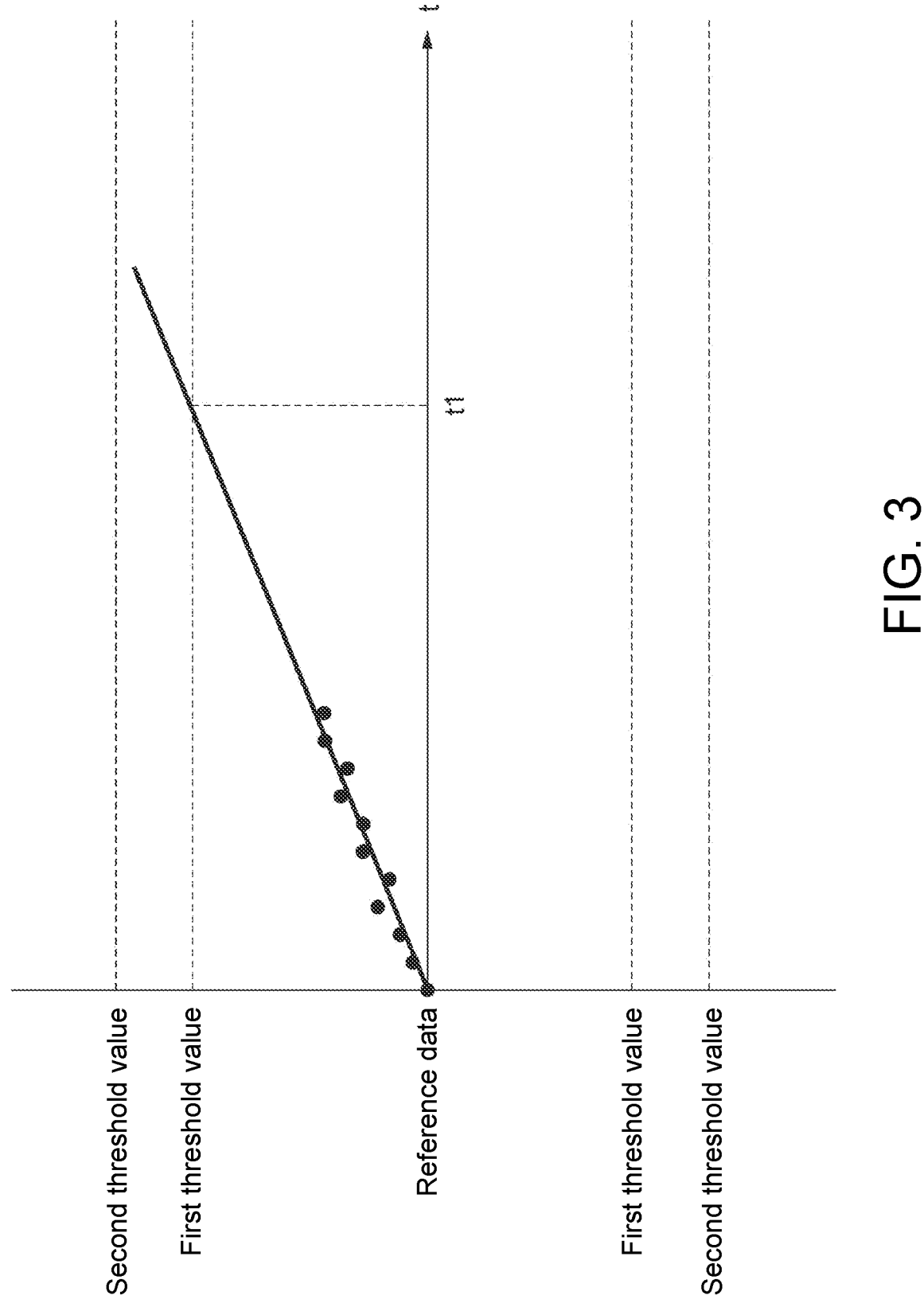
FIG. 3 is a diagram showing an example of the transition of the change from diagnosis data in an initial state.

FIG. 3 is a diagram showing an example of the transition of the change from diagnosis data in an initial state. In the example shown in FIG. 3, the diagnosis data 121 is periodically acquired, and the number of pieces of data of the diagnosis data 121 is accumulated with the passage of time. The prediction part 113 calculates a function that approximates the transition of the change from the diagnosis data 121 in the initial state on condition that the number of pieces of data of the diagnosis data 121 is greater than or equal to a predetermined number, and displays the calculated function as a graph. In this example, the diagnosis data 121 is a graph in which the data value increases with the passage of time, and the time point t1 at which the diagnosis data 121 reaches the first threshold value 122 is set as the time point for performing maintenance of the wire bonding device 10.

FIG. 4 is a diagram showing an example of the setting history at the time point of maintenance of the wire bonding device 10. In the example shown in FIG. 4, the data items of the setting history include, for example, the maintenance type, the maintenance item, and the scheduled maintenance date. A start button B1 and a completion button B2 for the maintenance are provided at positions adjacent to these data items. When the start button B1 is operated, the corresponding maintenance is manually started. When the completion button B2 is operated, the performance of the corresponding maintenance is completed.

Next, the notification process of the wire bonding quality inspection result in the wire bonding device 10 according to an embodiment will be described with reference to the flowchart shown in FIG. 5.

Figure 5:
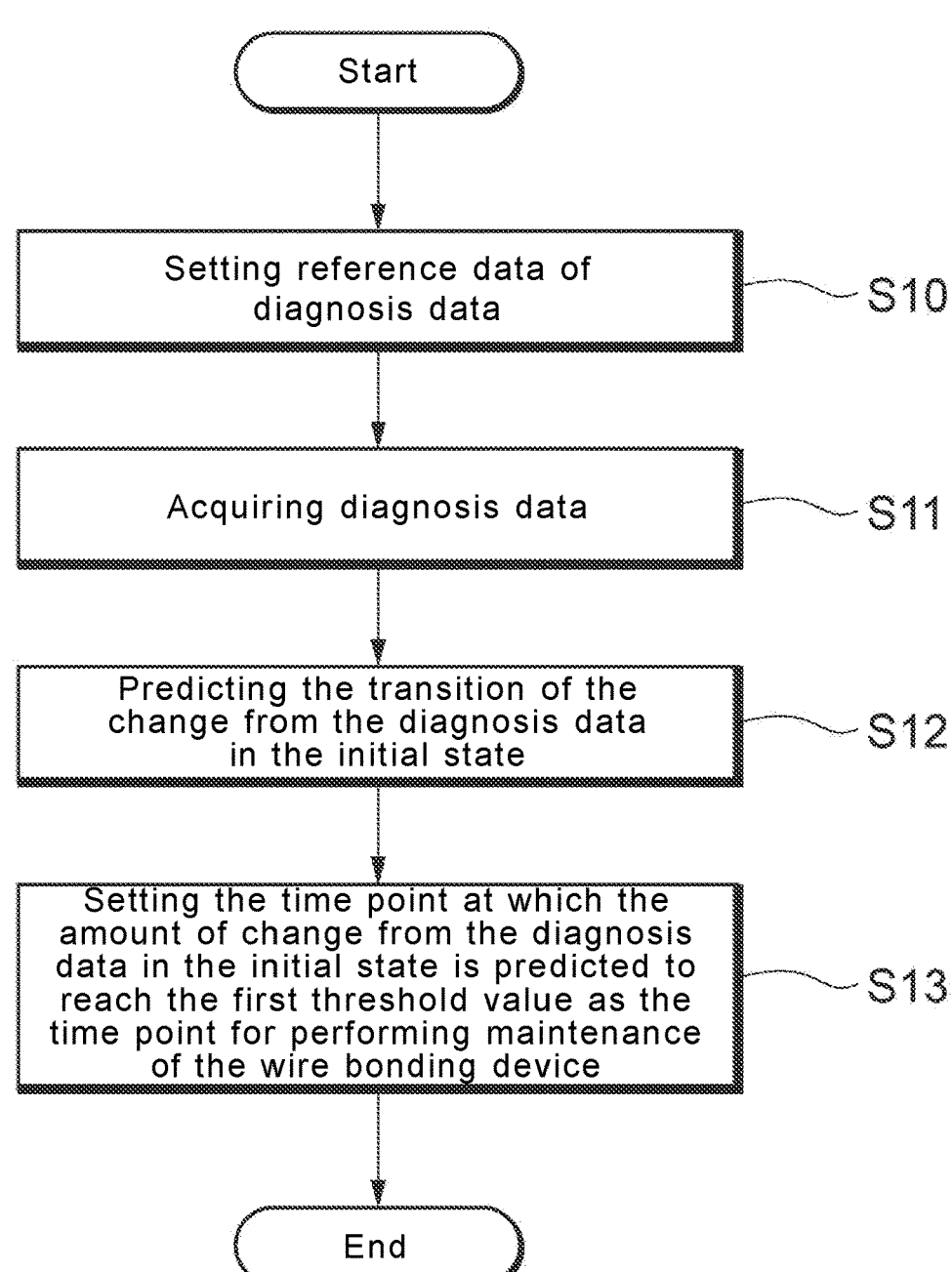
FIG. 5 is a flowchart showing an example of a maintenance process in the wire bonding device according to an embodiment.

As shown in FIG. 5, the wire bonding device 10 sets the reference data of the diagnosis data 121 (step S10). Next, the wire bonding device 10 acquires the diagnosis data 121 (step S11). Next, the wire bonding device 10 predicts the transition of the change from the diagnosis data 121 in the initial state (step S12). Next, the wire bonding device 10 sets a time point at which it is predicted that the amount of change from the diagnosis data 121 in the initial state reaches the first threshold value 122 as a time point for performing maintenance of the wire bonding device 10 (step S13). This ends the flowchart shown in FIG. 5.

Next, the notification process of the wire bonding quality inspection result in the wire bonding device 10 according to an embodiment will be described with reference to the flowchart shown in FIG. 6.

Figure 6:
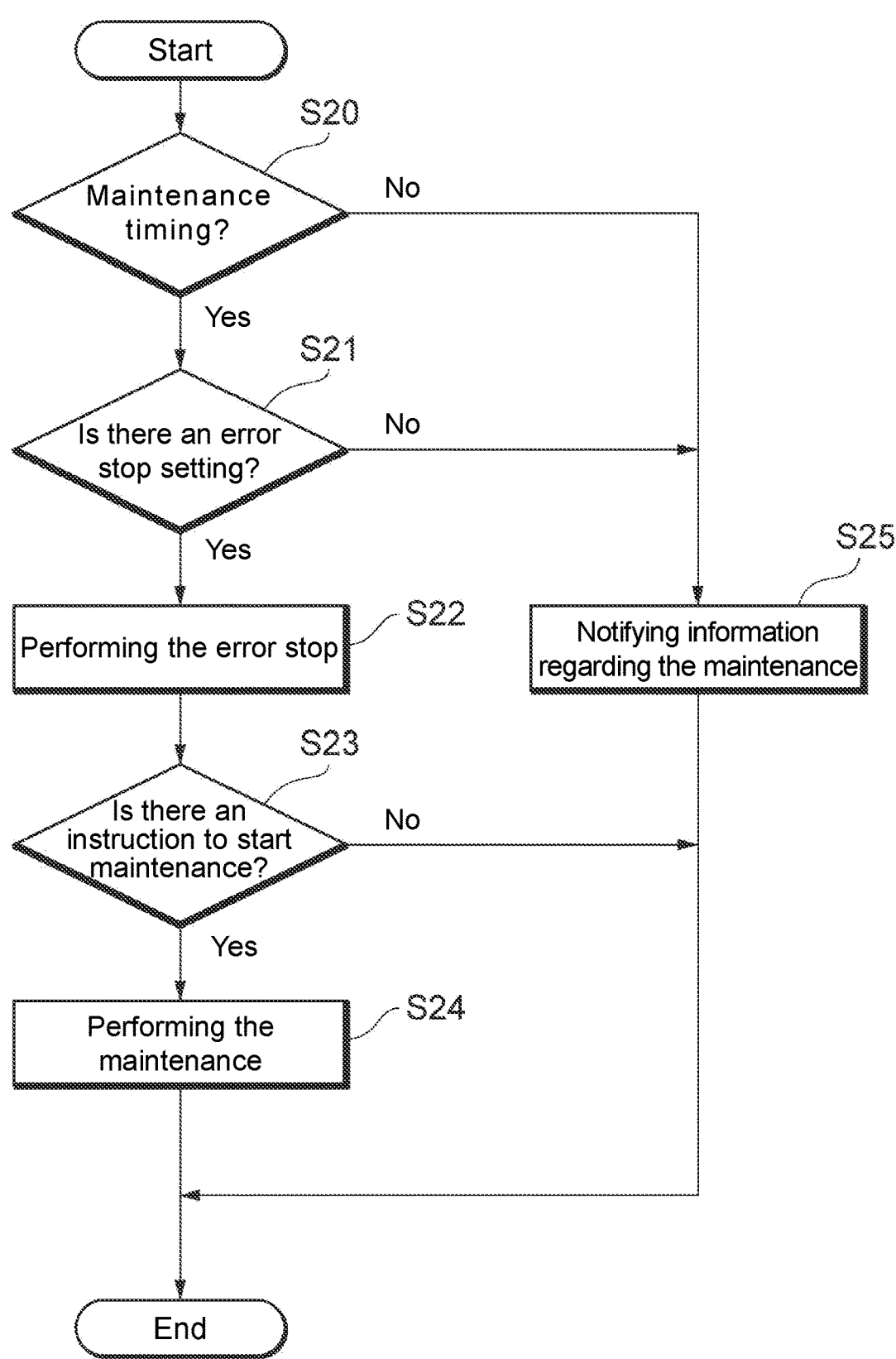
FIG. 6 is a flowchart showing an example of a notification process of a wire bonding quality inspection result in the wire bonding device according to an embodiment.

As shown in FIG. 6, the wire bonding device 10 determines whether the current time point has reached the time point for performing the maintenance of the wire bonding device 10 (step S20). When the wire bonding device 10 determines that the time point for performing maintenance of the wire bonding device 10 has been reached (step S20=YES), at the time point at which the amount of change from the diagnosis data 121 in the initial state reaches the first threshold value 122, the wire bonding device 10 determines whether it has been set to perform the error stop of the wire bonding device 10 (step S21). When the wire bonding device 10 determines that it has been set to perform the error stop of the wire bonding device 10 (step S21=YES), the wire bonding device 10 performs the error stop (step S22). Next, the wire bonding device 10 determines whether there is an instruction to start maintenance (step S23). When the wire bonding device 10 determines that there is an instruction to start maintenance (step S23=YES), the wire bonding device 10 performs maintenance (step S24), and ends the flowchart shown in FIG. 6. On the other hand, when the wire bonding device 10 determines that there is no instruction to start maintenance (step S23=NO), the wire bonding device 10 ends the flowchart shown in FIG. 6 without performing maintenance. In addition, when it is determined whether the current time point has reached the time point for performing the maintenance of the wire bonding device 10 (step S20=NO), or when it is determined whether it has been set to perform the error stop of the wire bonding device 10 (step S21=NO), the wire bonding device 10 notifies information regarding maintenance (step S25), and ends the flowchart shown in FIG. 6.

The above embodiment may be carried out in the following modes.

In the above embodiment, the first threshold value may be set as an initial value in advance before performing maintenance.

In the above embodiment, the setting of the second threshold value, which is the threshold value of the diagnosis data 121 when the operation of the wire bonding device 10 is stopped, may be omitted.

The wire bonding device 10 according to the above embodiment has been described above by exemplifying a case where the terminal of the semiconductor chip 50 and the terminal of the substrate 51 are electrically connected by the wire 60. Instead of this, for example, the wire bonding device according to the above embodiment may be applied to the case where a semiconductor module is configured by electrically connecting the terminal of the semiconductor chip 50 and the terminal of a lead frame by the wire 60. Further, for example, the wire bonding device according to the above embodiment may be applied to a case where a bump is formed on any electrode such as the terminal of the semiconductor chip 50 by the wire 60.

What is claimed is:

1. A maintenance method for notifying information regarding maintenance of a wire bonding device, the maintenance method comprising:

a step of acquiring time-series data of a diagnosis result regarding an operation of the wire bonding device for a plurality of maintenance items, calculating a function that approximates a transition of a change from the diagnosis result in an initial state, and predicting the transition of the change from the diagnosis result in the initial state, wherein the plurality of maintenance items include cleaning and calibration of the wire bonding device, and the transition of the change from the diagnosis result is selected from XYZ Lissajous, XYZ deviation, XY guide, Z load, US impedance, US frequency, US calibration, and CL load, the diagnosis result comprises data derived from an XYZ Lissajous waveform of the operation of the wire bonding device; and a step of setting a time point at which it is predicted that an amount of change from the diagnosis result in the initial state for the plurality of maintenance items reaches a first threshold value as a time point for performing the maintenance of the wire bonding device for each of the plurality of maintenance items.

2. The maintenance method according to claim 1, further comprising a step of notifying the set time point for performing the maintenance of the wire bonding device and a step of switching, at the predicted time point at which the amount of change from the diagnosis result in the initial state reaches the first threshold value, between performing an error stop of the wire bonding device or notifying information regarding the maintenance of the wire bonding device based on whether a predetermined operation is received.

\* \* \* \* \*